US009411246B2

(12) United States Patent  
Williamson (10) Patent No.: US 9,411,246 B2  
(45) Date of Patent: Aug. 9, 2016

(54) FULL-FIELD MASKLESS LITHOGRAPHY PROJECTION OPTICS

(75) Inventor: David Michael Williamson, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 477 days.

(21) Appl. No.: 13/538,287

(22) Filed: Jun. 29, 2012

(65) Prior Publication Data

US 2013/0003166 A1    Jan. 3, 2013

Related U.S. Application Data

(60) Provisional application No. 61/571,566, filed on Jun. 30, 2011.

(51) Int. Cl.  
*G02F 1/29* (2006.01)  
*G03F 7/20* (2006.01)

(52) U.S. Cl.  
CPC ........ *G03F 7/70225* (2013.01); *G03F 7/70291* (2013.01)

(58) Field of Classification Search  
CPC .......................... G03F 7/70291; G03F 7/70225  
USPC ......... 359/318, 365, 649, 726, 727, 725, 754; 355/66, 67, 71  
See application file for complete search history.

(56) References Cited

U.S. PATENT DOCUMENTS

| 5,523,193 | A | 6/1996 | Nelson |
| 7,110,082 | B2 | 9/2006 | Smirnov et al. |
| 7,580,197 | B2 * | 8/2009 | Omura ................... G02B 17/08 359/649 |
| 2006/0138349 | A1 * | 6/2006 | Bleeker et al. ............ 250/492.2 |
| 2008/0278799 | A1 * | 11/2008 | Beder et al. .................. 359/362 |
| 2009/0207487 | A1 * | 8/2009 | Feldmann et al. ........... 359/364 |

FOREIGN PATENT DOCUMENTS

WO    2004019128 A2    3/2004

* cited by examiner

*Primary Examiner* — Scott J Sugarman  
*Assistant Examiner* — Mustak Choudhury  
(74) *Attorney, Agent, or Firm* — Yakov Sidorin; Quarles & Brady, LLP (57) ABSTRACT

Projection optics for a lithographic projection system is provided that comprises a spatial light modulator (SLM) from which radiation is reflected and directed to a projection lens that projects the radiation to a substrate. The SLM is illuminated by non telecentric off axis illumination (e.g. from laser radiation that has a spectral bandwidth of the order of 1 picometer, and the projection optics is configured for significant reduction (e.g. at least 10× reduction, 20× reduction, or 50× reduction).

9 Claims, 3 Drawing Sheets

FULL-FIELD MASKLESS LITHOGRAPHY PROJECTION OPTICS

RELATED APPLICATION/CLAIM OF PRIORITY

This application is related to and claims priority from provisional application Ser. No. 61/571,566, entitled "Full-field maskless lithography projection optics", filed Jun. 30, 2011, which provisional application is incorporated by reference herein.

INTRODUCTION

The present embodiment relates to lithographic projection optics, e.g. of the type that would project an image to a substrate that is used in the production of a semiconductor wafer. The present embodiment is particularly directed to lithographic projection optics that are designed with a numerical aperature (NA of 1.0 or more.

The projection optics of the present embodiment preferably comprises a spatial light modulator (SLM) from which radiation is reflected and projected to a substrate, where the SLM is illuminated by non telecentric off axis illumination.

Preferably, a fluid (e.g. water) is provided between the substrate and the last optical element of the projection optics. Additionally, the projection optics include a catadioptric projection lens arrangement, and utilize the off axis, non telecentric illumination of the SLM, to reflect illumination without the use of beamsplitters. Additionally, the SLM and projection optics are configured for significant reduction of the image projected to the substrate. For example, the SLM and projection optics can be configured e.g. for at least 10× reduction, at least 20× reduction, and higher reductions (e.g. at least 50× reduction).

In applicant's experience,
  a. projection optics, as described in U.S. Pat. No. 5,523,193 does not have both the NA and field size of current mask-projection lithography systems—i.e. NA 1.35 and a 26 mm field size on the substrate. Such projection optics is therefore limited in the optical throughput and resolution that it can provide.
  b. In U.S. Pat. No. 7,110,082, projection optics are disclosed that includes a beamsplitter in the illumination system and the projection optics are limited in the maximum NA and field size that they can achieve by the mechanical size limits of high quality optical glass used for the fabrication of a beamsplitter. Furthermore, a beamsplitter is either highly inefficient in terms of light transmission, or precludes the advantageous use of azimuthally-polarized light for higher resolution, as needed to take full advantage of hyper-NA's>1.0.
  c. A catadioptric mask-projection optics design, such as that described in WO 2004/019128 A2 is capable of a high NA of 1.35 and a 26 mm field size on the substrate, but is of 4× demagnification (reduction), instead of the 10× reduction required for an SLM, and are telecentric at the reticle plane. Applicant believes a projection optics for an SLM must be non-telecentric at the SLM plane to allow off-axis illumination of the reflecting microelectromechanical (MEMS) actuators, or actuators on the scale of a few tens or hundreds of nanometers (NEMS), without either obscuration or a beamsplitter.
  d. Finally, prior-art mask-projection optical designs have sufficiently small chromatic aberrations only when the light source is a line-narrowed excimer laser with spectral bandwidth of the order of 0.1 pm (picometer) FWHM (full width half maximum). Lasers that are preferred for use in maskless projection systems operate around 193 nm and have spectral bandwidths an order of magnitude greater than this, of the order of 1 pm FWHM. This would lead to an unacceptable loss of image contrast with prior-art catadioptric optical designs.

SUMMARY

The projection optics of the present embodiment are designed to address the foregoing issues related to the prior systems described above.

The present embodiment provides new and useful projection optics for a lithographic projection system. The projection optics comprises a spatial light modulator (SLM) from which radiation is reflected and directed to a projection lens that projects the radiation to a substrate, where the SLM is illuminated by non telecentric off axis illumination.

In a currently preferred embodiment, the projection lens comprises a catadioptric projection lens, and a fluid is provided between the substrate and the last optical element of the projection lens.

The projection optics is configured to provide the projection system with an NA of 1.0 or more.

The SLM is illuminated with radiation that has a spectral bandwidth of the order of 1 picometer, and the catadioptric projection lens of the embodiment is particularly useful for covering this spectral bandwidth.

The projection optics is preferably configured to satisfy the following condition a.  $R_m/[2 \times \text{Half Field}]$ where the catadioptric projection lens includes a concave mirror, $R_m$ is the radius of the concave mirror, and the Half Field is the half field height of the image field.

In addition, the projection optics also preferably satisfies the following condition a.  $D/[\text{Half Field}]$ where the concave mirror of the catadioptric projection lens provides an aperature stop, D is a sum of the thicknesses of all of the optics between the image plane and the aperature stop, and the Half Field is the half field height of the image field.

The problem of maskless projection optics, where the NA is limited to substantially less than 1.0, is also addressed, according to the present embodiment, by providing a fluid, such as water, between the substrate surface and the last optical element of the projection system, allowing a numerical aperture of 1.0 or more. Additionally, the present embodiment addresses the other issues discussed above, by a 10×-reduction, 20× reduction or 50× reduction projection system that has both the full NA of a mask-based immersion system of 1.35 and a full instantaneous field size on the substrate of 26 mm, thereby allowing a high optical throughput and resolution while using a laser light source of spectral bandwidth of the order of 1 pm (picometer) and the off-axis, non telecentric illumination of a reflecting SLM without the use of a beamsplitter. Still further, the projection optics are configured for use with radiation (e.g. laser generated radiation) that has a spectral bandwidth of the order of 1 picometer.

Further features of the present invention will be apparent from the following detailed description and the accompanying drawings and tables.

BRIEF DESCRIPTION OF THE DRAWINGS AND TABLES

Table 1 is a prescription table for the optics of the maskless projection system of FIG. 1, configured for a 10× reduction.

Table 2 is a prescription table of the optics of the maskless projection system of FIG. 2, configured for a 20× reduction.

DETAILED DESCRIPTION

As described above, the present embodiment relates to lithographic projection optics, e.g. of the type that would project an image to a substrate that is used in the production of a semiconductor wafer. The present embodiment is particularly directed to lithographic projection optics that are designed to allow a numerical aperature (NA of 1.0 or more. Moreover, the projection optics of the present embodiment are configured for at least 10× reduction, as shown and described in connection with FIG. 1 and Table 1, or for at least 20× reduction, as shown and described in connection with FIG. 2 and Table 2, and from that description, the manner in which the present embodiment can be used for significantly greater reduction (e.g. at least 50× reduction), will be apparent to those in the art.

Figure 1:
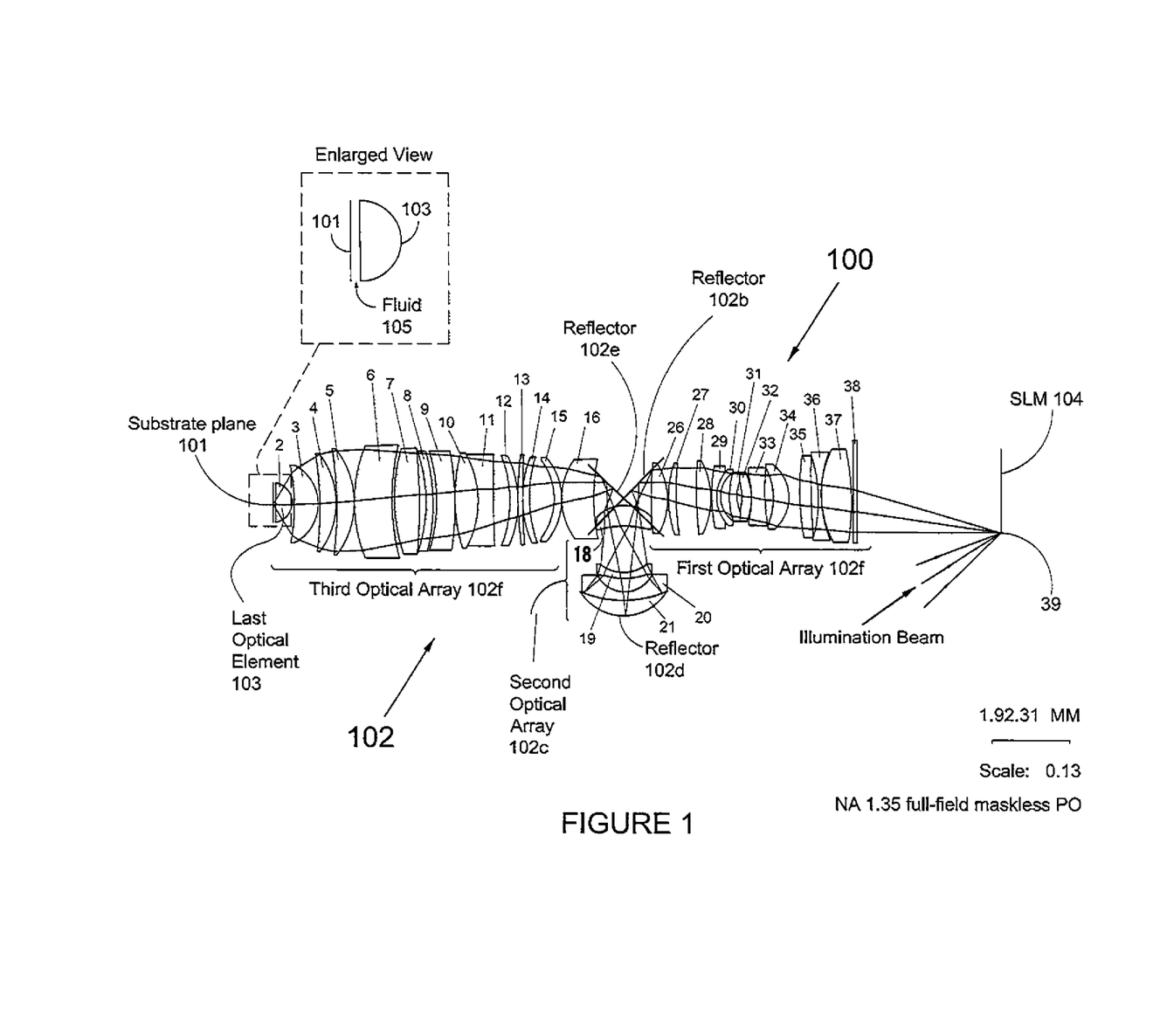
FIG. 1 is a schematic illustration of a maskless projection optics system, according to the present embodiment.

As shown in FIG. 1 and in Table 1, the projection optics of the present embodiment can be designed for at least a 10× reduction ratio, with a 1.35 numerical aperature (NA) catadioptric projection lens 102, with an instantaneous line (1-D) field of view on a substrate 101 of 26 mm. The projection optics 100 utilitize maskless lithography principles where the traditional mask, or reticle, is replaced by a Spatial Light Modulator (SLM) 104, which may take the form of a 1-dimensional array of microelectromechanical (MEMS) actuators, or actuators on the scale of a few tens or hundreds of nanometers (NEMS). U.S. Pat. Nos. 5,523,193, and 7,110,082 and which are incorporated by reference herein, provides additional information on SLM technology.

The SLM's are reduced in scale by a factor of at least 10× onto the substrate 101, which is scanned past the projection lens 100 in synchronism with programmed changes to the SLM 104. In FIG. 1, the SLM 104 has a 1-D array that is perpendicular to the plane of the figure, and 260 mm in length, illuminated in off-axis non telecentric fashion by light from a high-rep-rate laser source (with wavelength of about 193 nm). The field length on the substrate for this design is 26 mm (10× at the SLM, 260 mm)—it is in and out of the plane of the paper of FIG. 1—the field in the plane of the paper is very small, depending on the SLM, like about 0.1 mm or less, so only one field point appears on the drawing to represent this. That field point is shown at 39 in FIG. 1.

Traditional maskless optical lithography has suffered from a low optical throughput and inferior resolution, in part because of limitations of the SLM pixel size, and in part by projection optical designs that have not kept pace with developments in optical lithography using masks, or reticles.

This embodiment provides projection optics designed to provide the same NA and field size on the wafer as state-of-the-art mask-based optical lithography, but to also provide a higher reduction ratio of at least 10×, the ability to use off axis, non-telecentric SLM illumination suitable for reflecting MEMS or NEMS without the use of beamsplitters, and a spectral bandwidth of the order of 1 pm (picometer), which allows for the use of a relatively low-cost high-rep-rate laser source.

The projection optics 100 of the present embodiment, as shown in FIG. 1 comprises an SLM 104 that reflects radiation from the illumination source, and the radiation is projected to the substrate 101 by a catadioptric lens system 102. the catadioptric lens system 102 comprises (i) a first optical array 102a that projects the radiation to a reflector 102b, which reflects the radiation to a second optical array 102c. The radiation is then reflected from a reflector 102d (a concave mirror) and directed back through the second optical array to a reflector 102e, which reflects the radiation to the substrate via a third optical array 102f, which includes the last optical element 103. As shown in FIG. 1, particularly the expanded portion 1a, a fluid 105, such as water, is provided between the last optical element 103 and the substrate 101.

The catadioptric lens system 102 comprises a first imaging optical system (26-38), a second imaging optical system (18-21, 102d), and a third imaging optical system (2-16). The first imaging optical system (26-38) arranged between an object surface that is SLM surface and an image surface that is substrate surface 100. The first imaging optical system (26-38) forms a first intermediate image of the object surface. The second imaging optical system (18-21, 102d) having the concave mirror 102d that forms a second intermediate image of the object surface. The third imaging optical system (2-16) arranged between the first imaging optical system and the image plane that forms an final image on the image plane. The catadioptric lens system 102 further comprising reflectors 102b, 102e as folding mirrors. The reflector 102b is arranged in an optical path between the first imaging optical system and the second imaging optical system. The reflector 102e is arranged in an optical path between the second imaging optical system and the third imaging optical system. Optical axes of the first and third imaging optical systems are colinear. Optical axes of the first through third optical systems cross at one point. Ridge line formed by the reflectors 102b, 102e is arranged the one point (optical axes crossing point).

One preferred version of the embodiment, shown in FIG. 1, and Table 1, and described above, is designed to provide the features reference above that are believed to be particularly useful in a maskless projection optics system. For example, providing a fluid, such as water, between the substrate surface and the last optical element of the projection system, allows a numerical aperature (NA) of 1.0 or more. Additionally, the present embodiment addresses other issues discussed above, by a 10×-reduction projection system that has both the full NA of a mask-based immersion system of 1.35 and a full instantaneous field size on the substrate of 26 mm, thereby allowing a high optical throughput and resolution while using a laser light source of spectral bandwidth of the order of 1 pm (picometer) and the off-axis, non telecentric, illumination of a reflecting SLM without the use of a beamsplitter.

The system of FIG. 1 and the prescriptions of Table 1 provide the system with a 10× reduction.

The SLM 104 is illuminated with radiation that has a spectral bandwidth of the order of 1 picometer, and the catadioptric projection lens 102 shown in FIG. 1 is particularly useful for covering this spectral bandwidth.

The projection optics is preferably configured to satisfy the following condition $$R_m/[2 \times \text{Half Field}] \qquad \text{a.}$$

where the catadioptric projection lens includes the concave mirror 102d, $R_m$ is the radius of the concave mirror, and the Half Field is the half field height of the image field (in the example of FIG. 1, the field is 26 mm).

In addition, the projection optics also preferably satisfies the following condition D/[Half Field]   a.

where the catadioptric projection lens includes the concave mirror 102*d* that provides an aperature stop, D is a sum of the thicknesses of all of the optics between the image plane and the aperature stop, and the Half Field is the half field height of the image field (e.g. 13 in the example of FIG. 1 and Table 1).

Each of the foregoing conditions provides the projection optics with performance that effectively corrects for field curvature, and the best correction is provided when both conditions are satisfied.

Figure 2:
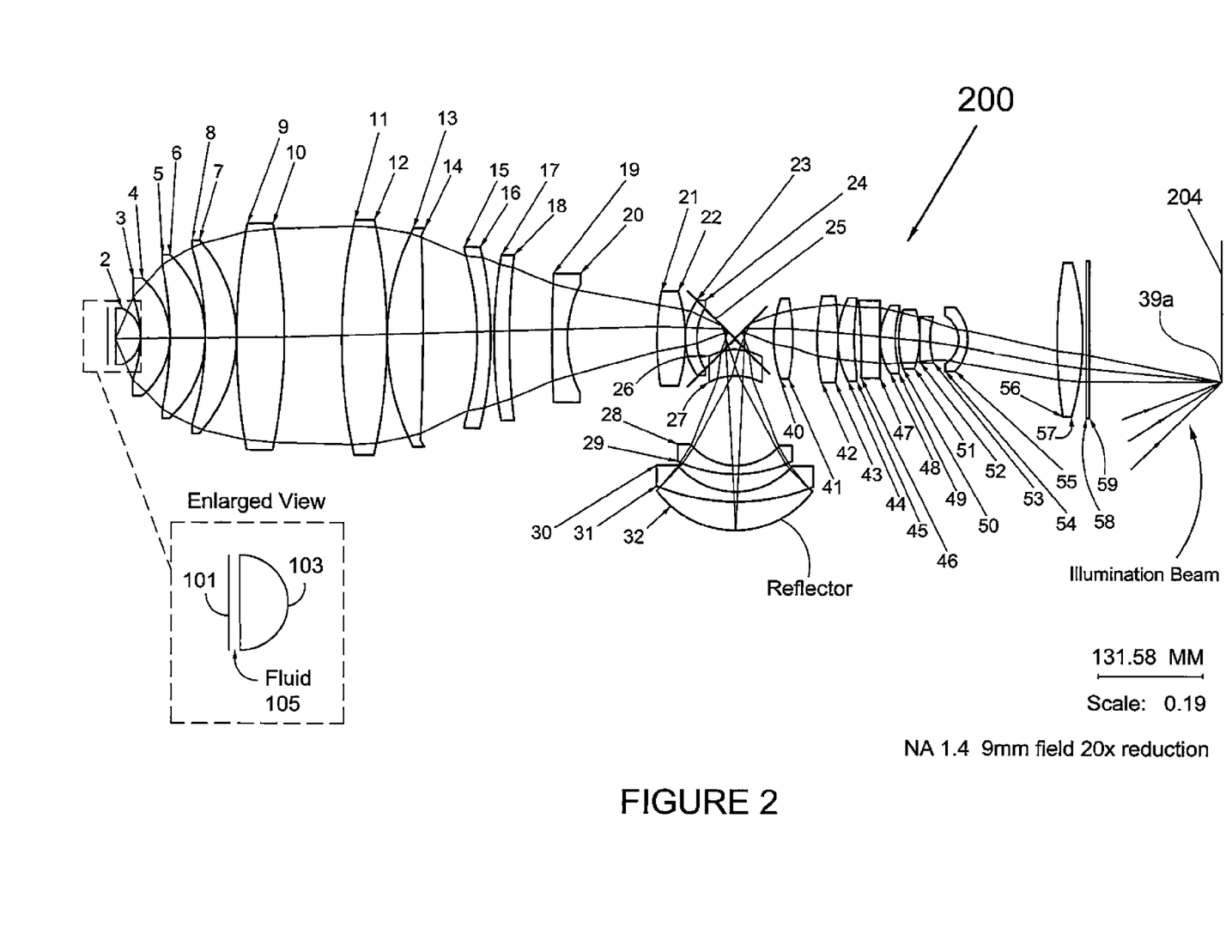
FIG. 2 is a schematic illustration of another maskless projection optics system, according to the present embodiment.

FIG. 2 and Table 2 provide maskless projection optics configured for a 20× reduction. In FIG. 1, the projection optics are shown at 200, and an SLM 204 has a 1-D array that is perpendicular to the plane of the figure, and slightly more than 260 mm in length (as described below), illuminated off-axis by light from a high-rep-rate laser source. The image field length on the substrate for this design is about 26 mm—it is in and out of the plane of the paper of FIG. 2—the field in the plane of the paper is very small, depending on the SLM, like about 0.1 mm or less, so only one field point appears on the drawing to represent this. That field point is shown at 39*a* in FIG. 2. However, it should be noted that the example of FIG. 2, Table 2 is configured for 9 mm image fields, where 3 such image fields that are effectively stitched together make up the full image field. When the projection optics are configured for 20× reduction and 9 mm image fields that are stitched together (e.g. combined) are used to form the full image field, the SLM components can be made larger, which makes them easier to fabricate.

The Projection optics of FIG. 1 and the prescriptions of Table 1 are configured for 10× reduction and the projection optics of FIG. 2 and the prescriptions of Table 2 are configured for 20× reduction. More specifically with the specific projection optics shown in FIG. 1 and the prescriptions of Table 1, the condition $R_m$/[2×Half Field] numerically translates into 134.272/[2×13]=5.15, and the condition D/[Half Field] numerically translates into 1170.8/13=90.06 (for 10× reduction), and the condition $R_{m'}$/[2×Half Field] numerically translates into 105.669/[2×4.5]=11.7 and the condition D/[Half Field] numerically translates into 872.6/4.5=193.92 (for 20× reduction), suggesting that the condition $R_m$/[2×Half Field] is satisfied in a range from about 4 to about 7, and from about 10 to about 13 (for 10× reduction and 20× reduction, respectively), and where D/[Half Field] is satisfied in a range from about 80 to about 100, and from about 180 to about 210 (for 10× and 20× reduction, respectively). With projection optics that meet the foregoing conditions, significantly higher reductions (e.g. at least 50×) should be possible.

Accordingly, the foregoing description provides maskless projection optics that are capable of significant reductions (e.g. at least 10× and 20× reductions) The projection optics comprises a spatial light modulator (SLM) from which radiation is reflected and directed to a projection lens that projects the radiation to a substrate. The SLM is illuminated by non telecentric off axis illumination, and the projection lens preferably comprises a catadioptric projection lens. A fluid is provided between the substrate and the last optical element of the projection lens. The projection optics is configured to provide the projection system with an NA of 1.0 or more. The SLM is illuminated with radiation that has a spectral bandwidth of the order of 1 picometer, a catadioptric projection lens is particularly useful for covering this spectral bandwidth. The projection optics described herein are capable of at least 10× and 20× reduction, and the principles of the embodiment are designed such that considerably higher reductions (e.g. on the order of 50×) can be achieved.

Figure 3:
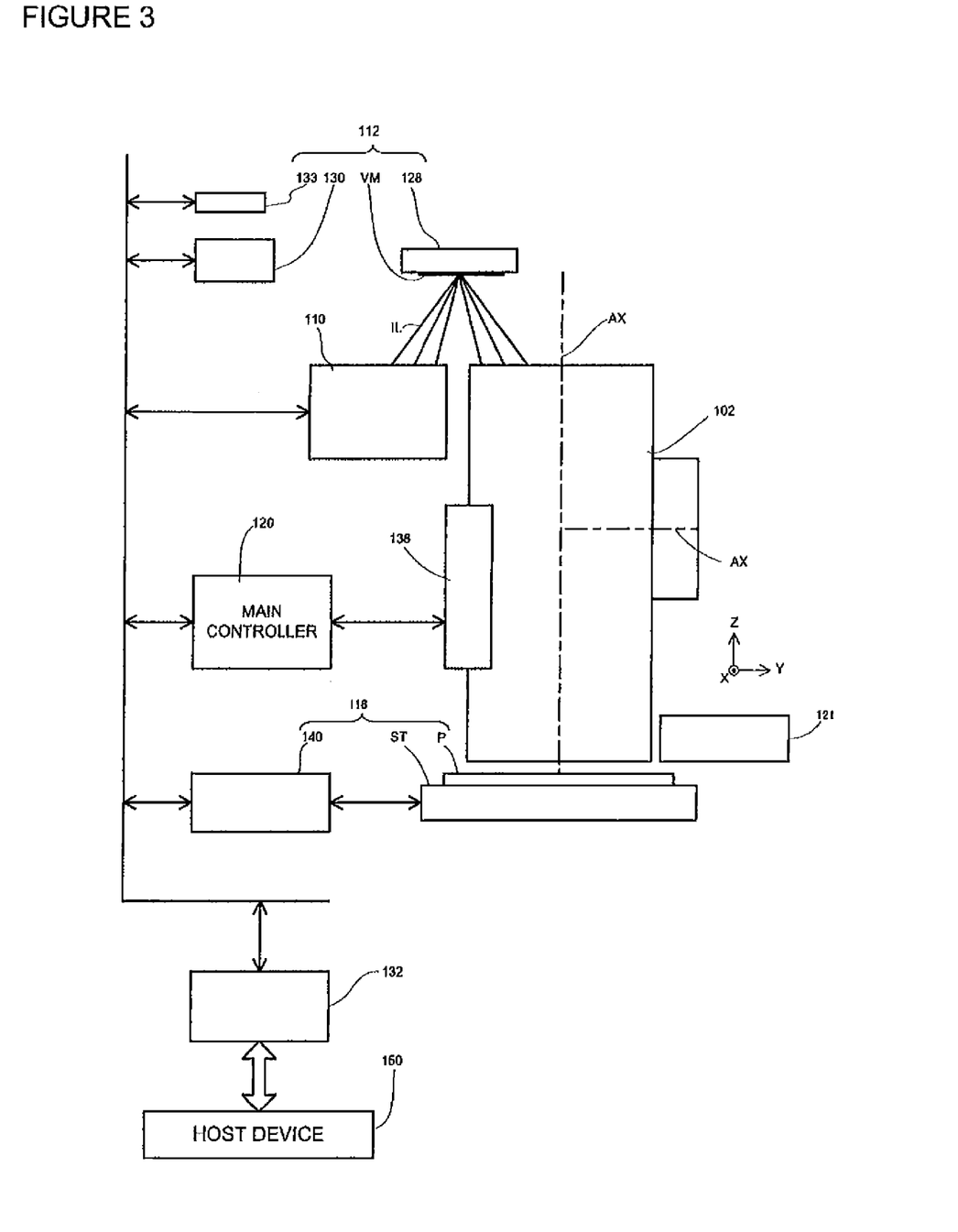
FIG. 3 is an exemplary drawing schematically showing a configuration of an exposure apparatus according to an embodiment

The exposure apparatus is shown in FIG. 3 and is equipped with an illumination system 110, a pattern generation device 112 (that includes (SLM 104), the catadioptric lens system 102, a stage device 116, a control system that controls these devices and systems, and the like. The exposure apparatus shown in FIG. 3 performs an exposure process by projecting an image of a pattern, which is generated by the pattern generation device 112, on a plate (sensitive substrate) P mounted on a stage ST that constitutes a part of the stage device 116, via the catadioptric lens system 102. Further, the exposure apparatus shown in FIG. 3 is a scanning exposure apparatus that forms patterns on the plate P by synchronizing switching (changing) of a pattern generated by the pattern generation device 112 with movement of the plate P. In following descriptions, it is supposed that a direction parallel to the optical axis AX of the projection optical system PL is the Z-axis direction, a direction in which the plate P is scanned relatively to the catadioptric lens system 102 on a plane orthogonal to the Z-axis is the Y-axis direction, and a direction orthogonal to the Z-axis and the Y-axis is the X-axis direction. Further, it is supposed that rotation (inclination) directions around the X-axis, the Y-axis, and the Z-axis are, respectively, the θx, θy, and θz directions.

The control system includes a microcomputer, and is composed mainly of a main controller 120 that controls the entire exposure apparatus. The control system is connected to a host device 150, which is composed of a workstation or the like, via an interface 132. The interface 132 is a communication interface that controls communication with the host device 150.

The illumination system 110 performs uniform illumination of a variable molding mask VM (including SLM 104), which constitutes a part of the pattern generation device 112, with an illumination light (exposure light) IL, and is equipped with; a light source system including a light source and a light source control system; an illumination optical system including a collimating lens, an optical integrator, an illumination condition setting mechanism capable of changing light quantity distributions of illumination lights on the pupil plane of the illumination optical system, a field stop, a relay lens, a prism, and so on; and the like (not shown).

Here, as the light source, as disclosed, e.g., U.S. Pat. No. 7,023,610 or the like, a harmonic generator that outputs an ultraviolet light (pulsed light), being an eighth-harmonic with a wavelength in a range from 193 to 194 nm, which is obtained from a single wavelength laser light with a wavelength of 1.544 to 1.553 μm oscillated from a single wavelength oscillation laser such as a DFB semiconductor laser or a fiber laser (e.g. the ytterbium-doped fiber laser), by amplifying the light with a fiber amplifier to which erbium (or both erbium (Er) and ytterbium (Yb)) is doped, and by converting its wavelength with a nonlinear optical crystal, is used.

The illumination condition setting mechanism includes, e.g., a shaping optical system that is placed on the incident side of the optical integrator in the illumination optical system, and has a plurality of optical elements including. are placeable diffractive optical element, a movable prism, a zooming optical system, a polarization member, and the like, e.g., and changes intensity distributions (shape and/or size of a secondary light source) of the illumination light IL on the pupil plane of the illumination optical system, i.e., illumination conditions of the variable molding mask VM by replacement, movement, or the like of at least one optical element. As the optical integrator, e.g., a fly-eye lens, a rod type integrator, a diffraction element, or the like can be used.

The pattern generation device 112 is an electronic mask system that generates a variable pattern to be projected onto the plate P mounted on the stage ST, and is equipped with: the variable molding mask VM; a holder 128 that holds the variable molding mask VM; a drive system (controller) 130 that controls operation states of the variable molding mask VM; a memory 133 and the like.

The variable molding mask VM is placed above (+Z side) the catadioptric lens system 102, and the illumination light IL is made incident to the mask. The variable molding mask VM includes, e.g., a DMD (Digital Micro-mirror Device, Deformable Micro-mirror Device), which is a type of a non-emissive image display element (called also a spatial light modulator(SLM)) and reflects/polarizes incident lights by units of mirror elements (micro mirrors) that are two-dimensionally arranged (placed) to spatially modulate intensities (amplitudes) of incident lights toward the catadioptric lens system 102. On a surface of the variable molding mask VM, the micro mirrors (mirror elements), being a plurality of modulation elements, are arranged in a form of a two-dimensional matrix, and a driving mechanism (actuator) that varies an incident angle (and output angle) of incident lights toward the micro mirrors is arranged on each micro mirror. In the present embodiment, a cover glass (not shown) of the DMD is formed from synthetic silica, since the illumination light IL with a wavelength in a range from 193 to 194 nm is used.

The drive system 130 acquires design data (e.g. CAD data) of a pattern of data necessary in forming a pattern image from the host device 150 via the interface 132. Then, the drive system 130 refers to various information (hereinafter, called "signal generation information") stored in the memory 133, and generates signals to drive each micro mirror of the variable molding mask VM based on the design data acquired. The signals to drive each micro mirror are supplied to the driving mechanism of each micro mirror. Thus, each micro mirror performs a binary action between an ON state and an OFF state, and generates a desired reflection pattern in the entire variable molding mask VM.

The drive system 130 can vary patterns to be generated by the variable molding mask VM based on the design data acquired. Thus, patterns generated by the variable molding mask VM can be appropriately varied synchronously with movement of the plate P mounted on the stage ST.

The catadioptric lens system 102 has a plurality of optical elements (lens elements and the like) that are arranged along the optical axes AX parallel with the Z-axis direction and Y-axis direction.

The catadioptric lens system 102 is non-telecentric at the SLM and telecentric at the substrate, and performs a reduced projection of a pattern generated by the pattern generation device 112 (the variable molding mask VM) at a projection magnification $\beta$ ($\beta$ is, e.g., 1/10, 1/20, 1/50 etc.) onto the plate P (i.e, the substrate) placed on the exposure surface. Further, an image-forming property compensation device 138, which drives particular lens elements inside the catadioptric lens system 102 in the optical axis AX direction and tilt directions for the XY plane orthogonal to the optical axis AX, is arranged in the catadioptric lens system 102. The image-forming property compensation device 138 adjusts image-forming states (image-forming properties of the projection optical system PL) of pattern images generated on the plate P via the catadioptric lens system 102. However, instead of the method to drive optical elements of the projection optical system PL or in a combination with the method, another method, e.g., to adjust wavelength properties of the illumination light IL (center of wavelength, spectrum width, or the like) by controlling the light source system can be employed.

The stage device 116 is equipped with: the stage ST that is movable while holding a plate (e.g., glass substrate, semiconductor wafer, or the like) Pt being an object to be exposed; and a stage drive system 140 that controls operation states (movement or the like) of the stage ST according to a command from the main controller 120.

The stage ST is movable in the X-axis, Y-axis, and Z-axis directions and rotatable in the θx, θy, and θz directions, and is capable of aligning the plate P in the 6 degrees of freedom to an image of a pattern generated by the variable molding mask VM through the catadioptric lens system. Moreover, to perform a scanning exposure of the plate P with the illumination light IL via the variable molding mask VM and the catadioptric lens system 102, the stage ST is moved in a predetermined scanning direction within the XY plane (e.g., the Y-axis direction that is the horizontal direction within the page surface in FIG. 1) at a desired speed, and thus, the plate P is moved synchronously with a variation of the pattern (displayed image) generated by the variable molding mask VM.

Positional information (including rotation information) of the stage ST is measured by a positional measurement system (not shown) (including, e.g., laser interferometers and/or encoders and also including focus sensors or the like if necessary (all are not shown)), and supplied to the main controller 120. The main controller 120 drives motors or the like of the stage drive system 140 based on the positional information and performs movement and positioning of the plate P.

The main controller 120 controls the operation of the illumination system 110, the pattern generation device 112, the stage device 116, or the like, to form an image of patterns generated sequentially on the plate P via the catadioptric lens system 102 by the variable molding mask VM. At the formation, the main controller 120 performs a scanning exposure by moving the plate P at an appropriate speed while scrolling patterns generated by the variable molding mask VM synchronously with movement via the drive system 130.

Here, the display speed V2 in the scanning direction of patterns displayed by the variable molding mask VM is given to be $V2=V1/\beta$, where V1 is the scanning speed of the stage ST holding the plate P. Therefore, in the present embodiment where the projection magnification $\beta$ of the catadioptric lens system 102 is 1/10 (1/20), the display speed V2 of the patterns generated by the variable molding mask VM in the scanning direction is 10 (20) times the speed V1 of the stage ST.

In the present embodiment, as shown in FIGS. 1 and 2, the optical path between the last optical element 103 located nearest to the image plane in the catadioptric lens system 102, and the substrate P (101 in FIGS. 1 and 2) is filled with a liquid (Fluid 105). The last optical element 103 is a positive lens with a convex surface on the object side and a plane on the image side. In the present embodiment, the liquid 105 is circulated in the optical path between the last optical element 103 and the plate P, using a supply and drainage system 121. The liquid 105 used herein can be pure water (deionized water) which is readily available in large quantity, for example, in semiconductor manufacturing factories and others.

For continuously filling the interior of the optical path between the last optical element 103 of the catadioptric lens system 102 and the substrate P with the liquid 105, applicable techniques include, for example, the technology disclosed in International Publication No. WO99/49504, the technology disclosed in Japanese Patent Application Laid-Open No. 10-303114, which are incorporated by reference herein. In the technology disclosed in International Publication No. WO99/49504, the liquid adjusted at a predetermined temperature is supplied from a liquid supply device through a supply tube and a discharge nozzle so as to fill the optical path between the last optical element 103 and the plate (substrate)

P and the liquid is collected from a liquid pool on the plate P through a collection tube and an inflow nozzle by the liquid supply device.

With the foregoing description in mind, the manner in which maskless projection optics can be provided for a projection system with an NA of 1.0 or more, with significant reduction between an SLM and an image field, and an SLM that is illuminated with radiation that has a spectral bandwidth of the order of 1 picometer will be apparent to those in the art.

TABLE 1

NA 1.35 26 mm field, 10x reduction ratio.

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| OBJECT | | INF | 1.0006 | | | 'Water' |
| 2 | INF | −51.4807 ex | 48.3666 | 36.1233 | 94.7799 | 'Si02' |
| | | | 1.0000 | | | |
| 3 | A(1) | −102.9547 ex | 61.8026 | 164.6729 | 185.1719 | 'Si02' |
| | | | 1.0000 | | | |
| 4 | A(2) | −220.1799 ex | 4.1.4671 | 231.5832 | 240.8522 | 'Si02' |
| | | | APERTURE STOP | | 24.0.8522 | |
| | | | 1.0000 | | | |
| 5 | A(3) | −235.4680 ex | 40.4190 | 255.0827 | 262.2823 | 'Si02' |
| | | | 2.0000 | | | |
| 6 | 336.5476 ex | A(4) | 100.0000 | 275.7675 | 258.2961 | 'Si02' |
| | | | 5.8020 | | | |
| 7 | 485.6802 ex | A(S) | 61.3163 | 257.9031 | 24.8.9255 | 'Si02' |
| | | | 15.2210 | | | |
| 8 | A(6) | −461.s000 ex | 22.0000 | 24.7.8270 | 245.0854 | 'Si02' |
| | | | 5.3899 | | | |
| 9 | A(7) | −634..3571 ex | 47.0011 | 243.5315 | 240.5825 | 'Si02' |
| | | | 1.0000 | | | |
| 10 | 472.6692 ex | A(8) | 53.6212 | 232.2470 | 227.5027 | 'Si02' |
| | | | 3.0958 | | | |
| 11 | A(9) | A(10) | 41.9867 | 226.1595 | 214..6457 | 'Si02' |
| | | | 37.5128 | | | |
| 12 | A(11) | −257.3996 ex | 20.9270 | 213.7061 | 218.6056 | 'Si02' |
| | | | 1.4454 | | | |
| 13 | A(12) | 1823.4238 cc | 11.0000 | 216.6803 | 214.1179 | 'Si02' |
| | | | 1.0000 | | | |
| 14 | A(13) | 293.0881 cc | 16.3074 | 210.8149 | 202.9404 | 'Si02' |
| | | | 63.9518 | | | |
| 15 | −153.2065 cc | −166.6086 ex | 15.5196 | 200.5901 | 207.6756 | 'Si02' |
| | | | 1.0000 | | | |
| 16 | 165.8289 ex | A(14) | 83.4178 | 194.2545 | 159.0267 | 'Si02' |
| | | | 72.0000 | | | |
| | DECENTER(1) | | | | | |
| 17 | | INF | −20.0000 | | 244.9942 | REFL |
| 18 | A(15) | −263.9657 ee | −50.0000 | 129.5359 | 122.9432 | 'Si02' |
| | | | −115.7908 | | | |
| 19 | 95.2590 cc | 178.1494 ex | −15.0000 | 119.2025 | 131.8115 | 'Si02' |
| | | | −35.2675 | | | |
| 20 | A(16) | 283.4529 ex | −18.0000 | 134.0235 | 205.6347 | 'Si02' |
| | | | −38.1998 | | | |
| 21 | | A(17) | 38.1998 | | 213.2785 | REFL |
| 22 | 283.4529 ex | A(18) | 18.0000 | 204.7025 | 131.6965 | 'Si02' |
| | | | 35.2675 | | | |
| 23 | 178.1494 ex | 95.2590 cc | 15.0000 | 127.2281 | 113.9924 | 'Si02' |
| | | | 115.7908 | | | |
| 24 | −263.9657 cc | A(19) | 50.0000 | 115.8872 | 126.0903 | 'Si02' |
| | | | 20.0000 | | | |
| | DECENTER(2) | | | | | |
| 25 | | INF | −72.0000 | | 251.6688 | REFL |
| 26 | A(20) | 189.1026 ex | −38.8156 | 167.3638 | 173.9257 | 'Si02' |
| | | | −1.0099 | | | |
| 27 | −282.8187 ex | A(21) | −23.1932 | 178.8684 | 176.9588 | 'Si02' |
| | | | −50.1707 | | | |
| 28 | −1116.7154 ex | A(22) | −36.8660 | 176.1508 | 175.2945 | 'Si02' |
| | | | −1.0000 | | | |
| 29 | −410.9989 ex | A(23) | −11.2474 | 153.5957 | 136.7626 | 'Si02' |
| | | | −1.6369 | | | |
| 30 | −104.4931 ex | −78.6581 ee | −11.4963 | 136.2023 | 124.7897 | 'Si02' |
| | | | −20.0107 | | | |
| 31 | −155.2029 ex | A(24) | −19.8642 | 125.5049 | 123.7563 | 'Si02' |
| | | | −10.4223 | | | |
| 32 | 936.3760 ee | 131.9612 ex | −25.6200 | 123.3864 | 122.7995 | 'Si02' |
| | | | −1.0000 | | | |
| 33 | 24.5.1282 cc | A(25) | −33.0397 | 116.9052 | 138.8177 | 'Si02' |
| | | | −20.4962 | | | |
| 34 | 216.4.708 cc | 98.0985 ex | −39.4.123 | 142.3347 | 156.4361 | 'Si02' |

TABLE 1-continued

| | | | | | | |
|---|---|---|---|---|---|---|
| 35 | A(26) | −3633.5454 cc | −29.9781 −27.3774 | 194..9764 | 197.6706 | 'SiO2' |
| 36 | 399.5441 cc | −311.6843 cc | −16.3330 −11.0000 | 198.2271 | 211.9056 | 'SiO2' |
| 37 | −268.4613 ex | A(27) | −1.0000 −73.4575 | 218.2713 | 227.8956 | 'SiO2' |
| 38 | INF | INF | −6.0000 −8.0000 | 231.3894 | 232.4271 | 'SiO2' |
| IMAGE | | IMAGE DISTANCE INF | −362.4104 | | 306.0035 | |

NOTES
Positive radius indicates the center of curvature is to the right
Negative radius indicates the center of curvature is to the left
Dimensions are given in millimeters
Thickness is axial distance to next surface
Image diameter shown above is a paraxial value, it is not a ray traced value aspheric constants $$z = \frac{(CURV)Y^2}{1 + (1 - (1+K)(CURV)^2 y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K E | A F | B G | C H | D J |
|---|---|---|---|---|---|---|
| A(1) | −0.229282E−02 | 0.00000000 1.66448E−24 | −1.11263E−08 −1.08989E−28 | −5.98143E−13 8.39734E−34 | −1.07855E−16 0.00000E+00 | −1.62046E−21 0.00000E+00 |
| A(2) | −0.139389E−02 | 0.00000000 1.99050E−25 | 3.77370E−08 4.90590E−31 | −3.22665E−12 −1.35665E−34 | 1.61929E−16 0.00000E+00 | −6.42816E−21 0.00000E+00 |
| A(3) | −0.131951E−02 | 0.00000000 −5.52250E−27 | 6.96560E−10 1.52379E−31 | −1.83084E−13 −2.22147E−35 | −4.78208E−18 0.00000E+00 | −5.88704E−23 0.00000E+00 |
| A(4) | 0.183028E−02 | 0.00000000 −1.37392E−26 | 3.82282E−09 −1.29624E−30 | 1.07463E−13 4.63766E−36 | 2.06748E−19 0.00000E+00 | 4.68616E−23 0.00000E+00 |
| A(5) | −0.100151E−02 | 0.00000000 1.90627E−26 | 1.91084E−08 −2.58639E−30 | −9.44167E−13 9.16700E−35 | 2.90889E−17 0.00000E+00 | −2.94130E−22 0.00000E+00 |
| A(6) | −0.199695E−02 | 0.00000000 2.36084E−26 | −2.36852E−08 4.37704E−30 | −6.42428E−13 −1.24755E−34 | 1.34314E−16 0.00000E+00 | −3.26306E−21 0.00000E+00 |
| A(7) | −0.325941E−02 | 0.00000000 −1.97607E−25 | 4.18797E−08 1.68865E−30 | 1.02926E−13 −2.27151E−34 | −1.03927E−16 0.00000E+00 | 5.64895E−21 0.00000E+00 |
| A(8) | −0.456163E−02 | 0.00000000 3.98573E−25 | 3.89408E−08 −4.32263E−29 | −2.16348E−12 1.14476E−33 | 7.86535E−17 0.00000E+00 | 2.80321E−21 0.00000E+00 |
| A(9) | −0.421046E−02 | 0.00000000 1.66987E−24 | 1.68457E−08 −6.12495E−29 | −7.54184E−13 5.52661E−34 | −3.21882E−17 0.00000E+00 | −1.36284E−20 0.00000E+00 |
| A(10) | −0.158201E−02 | 0.00000000 2.05265E−24 | 3.92165E−08 −1.37863E−28 | 4.15657E−12 5.04948E−33 | −8.83741E−18 6.00000E+00 | −2.49699E−20 0.00000E+00 |
| A(11) | −0.246640E−02 | 0.00000000 −2.12194E−25 | −5.10743E−08 1.16450E−29 | −2.20658E−12 1.19527E−33 | 3.28493E−16 0.00000E+00 | −1.11058E−20 0.00000E+00 |
| A(12) | −0.167792E−02 | 0.00000000 1.06085E−24 | 5.40029E−08 −5.81311E−29 | 4.20234E−12 1.52335E−33 | −1.66588E−16 0.00000E+00 | −9.27002E−21 0.00000E+00 |
| A(13) | 0.203868E−02 | 0.00000000 5.98250E−25 | 3.80146E−08 −2.09483E−29 | 7.31542E−13 8.84000E−35 | −5.40667E−17 0.00000E+00 | −3.09857E−21 0.00000E+00 |
| A(14) | 0.864389E−03 | 0.00000000 −1.02626E−24 | 5.92868E−08 9.61816E−29 | 1.88753E−12 −3.02627E−33 | 0.00000E+00 0.00000E+00 | 6.35715E−21 0.00000E+00 |
| A(15) | −0.01061486 | 0.00000000 −2.22930E−23 | 7.31117E−08 2.79540E−27 | 4.72031E−12 0.00000E+00 | 1.75568E−16 0.00000E+00 | 1.49320E−19 0.00000E+00 |
| A(16) | 0.01345904 | 0.00000000 −8.10312E−24 | 9.06880E−08 3.48281E−27 | 9.70759E−13 0.00000E+00 | 3.88094E−16 0.00000E+00 | 8.69584E−20 0.00000E+00 |
| A(17) | 0.744756E−02 | 0.00000000 1.64451E−25 | 8.49415E−09 −1.13746E−29 | 1.99546E−13 6.35073E−34 | 1.48132E−17 0.00000E+00 | −1.44582E−22 0.00000E+00 |
| A(18) | 0.01345904 | 0.00000000 −8.10312E−24 | 9.06880E−08 3.48281E−27 | 9.70759E−13 0.00000E+00 | 3.88094E−16 0.00000E+00 | 8.69584E−20 0.00000E+00 |
| A(19) | −0.01061486 | 0.00000000 −2.22930E−23 | 7.31117E−08 2.79540E−27 | 4.72031E−12 0.00000E+00 | 1.755688−16 0.00000E+00 | 1.49320E−19 0.00000E+00 |
| A(20) | −0.142786E−02 | 0.00000000 −1.77034E−24 | 4.95880E−08 1.74335E−28 | −1.19830E−12 −8.37401E−33 | −3.04842E−17 0.00000E+00 | 1.67276E−20 0.00000E+00 |
| A(21) | −0.628152E−04 | 0.00000000 2.49126E−24 | −3.06482E−08 −2.49309E−28 | −3.54581E−12 1.39330E−32 | 0.00000E+00 0.00000E+00 | −1.07160E−20 0.00000E+00 |
| A(22) | 0.515583E−02 | 0.00000000 −4.51826E−24 | 2.72779E−09 4.13949E−28 | −1.14893E−12 −1.68047E−32 | 0.00000E+00 0.00000E+00 | 2.02854E−20 0.00000E+00 |
| A(23) | −0.840457E−02 | 0.00000000 −8.94705E−24 | −9.55796E−08 5.85849E−27 | −2.69582E−12 4.04241E−32 | 3.17564E−16 0.00000E+00 | 8.20024E−20 0.00000E+00 |
| A(24) | −0.523792E−02 | 0.00000000 1.15501E−22 | 3.32642E−07 −1.36971E−26 | −8.15542E−12 1.79148E−30 | 0.00000E+00 0.00000E+00 | −3.42945E−19 0.00000E+00 |
| A(25) | −0.949688E−03 | 0.00000000 4.12302E−23 | −1.23923E−07 −3.55257E−27 | −3.52766E−12 0.00000E+00 | −9.79475E−16 0.00000E+00 | −6.80001E−20 0.00000E+00 |
| A(26) | −0.830463E−03 | 0.00000000 2.31180E−24 | −9.70811E−09 −4.29965E−29 | −8.17346E−13 0.00000E+00 | 0.00000E+00 0.00000E+00 | −3.31970E−20 0.00000E+00 |
| A(27) | 0.138798E−02 | 0.00000000 −3.78277E−27 | 3.16031E−08 3.79528E−31 | −1.43213E−12 0.00000E+00 | 3.20801E−17 0.00000E+00 | −2.62450E−21 0.00000E+00 |

TABLE 1-continued

DECENTERING CONSTANTS

| DECENTER | x | y | z | ALPHA | BETA | GAMMA | |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 4.5.0000 | 0.0000 | 0.0000 | (BEND) |

A decanter defines a new coordinate system (displaced and/or rotated) in which subsequent surfaces are defined.
Surfaces following a decanter are aligned on the local mechanical axis (z–axis) of the new coordinate system.
The new mechanical axis remains in use until changed by another decanter. The order in which displacements and
tilts are applied on a given surface is specified using different decanter types and these generate different new
coordinate systems; those used here are explained below. Alpha # beta, and gamma are in degrees.

DECENTERING CONSTANT KEY1

| TYPE | TRAILING CODE | ORDER OF APPLICATION |
|---|---|---|
| DECENTER | | DISPLACE (X, Y, Z)<br>TILT (ALPHA # BETA,GAMMA)<br>REFRACT AT SURFACE<br>THICKNESS TO NEXT SURFACE |
| DECENTER & BEND | BEND | DECENTER (X, Y, Z # ALPHA, BETA, GAMMA) REFLECT AT SURFACE<br>BEND {ALPHA, BETA, GAMMA)<br>THICKNESS TO NEXT SURFACE |
| REFERENCE WAVELENGTH = | 193.3 NM | |
| SPECTRAL REGION = | 193.3 | 193.3 NM |

In the diagram below, surface 1 is the wafer, surface 72 is the SLM.

TABLE 2

NA 1.4 9 mm field, 20x reduction ratio.

| ELEMENT NUMBER | RADIUS OF CURVATURE | | THICKNESS | APERTURE DIAMETER | | GLASS |
|---|---|---|---|---|---|---|
| | FRONT | BACK | | FRONT | BACK | |
| OBJECT | | INF | 0.5742 | | | 'Water' |
| 2 | INF | −32.7439 ex | 25.9208<br>0.5739 | 15.5405 | 56.1835 | 'SiO2' |
| 3 | 8(1) | −79.8360 ex | 31.9316<br>0.5739 | 94.2879 | 120.0513 | 'SiO2' |
| 4 | S(2) | −119.6885 ex | 37.2545<br>APERTURE STOP<br>0.5739 | 156.5199 | 169.5458<br>169.5458 | 'SiO2' |
| 5 | S(3) | −152.6987 ex | 33.5741<br>1.1477 | 191.4023 | 200.9885 | 'SiO2' |
| 6 | 711.0362 ex | S(4) | 50.0000<br>61.3276 | 228.6266 | 235.3130 | 'SiO2' |
| 7 | 560.7996 ex | −664.6806 ex | 46.9451<br>1.0000 | 244.0318 | 241.8862 | 'SiO2' |
| 8 | 245.4166 ex | S(5) | 40.0752<br>57.4116 | 227.1756 | 221.1822 | 'SiO2' |
| 9 | 8(6) | −412.7858 ex | 15.0000<br>2.8624 | 189.0007 | 185.2536 | 'SiO2' |
| 10 | 464.2259 ex | 836.4791 cc | 17.9863<br>45.3495 | 171.8008 | 164.2897 | 'SiO2' |
| 11 | 1385.5260 ex | S(7) | 17.7067<br>95.7942 | 132.4761 | 118.1379 | 'siO2' |
| 12 | 357.5695 ex | −176.6594 ex | 30.0000<br>0.5739 | 96.5215 | 91.1599 | 'SiO2' |
| 13 | 70.1041 ex | 71.4143 ee | 11.5957<br>41.3182 | 77.0078 | 68.5119 | 'SiO2' |
| | DECENTER(1) | | | | | |
| 14 | | INF | −11.4773 | 100.7373 | | REFL |
| 15 | −55.7576 ex | A(1) | −28.6932<br>−96.3281 | 50.8949 | 51.2268 | 'SiO2' |
| 16 | 63.1390 ce | 143.9128 ex | −8.6080<br>−19.5646 | 5196 | 117.9944 | 'SiO2' |
| 17 | A(2) | 227.6630 ex | −10.3295<br>−30.6008 | 122.4023 | 163.2910 | 'SiO2' |
| 18 | S(8) | | 30.6008 | 169.7031 | | REFL |
| 19 | 227.6630 ex | A(3) | 10.3295<br>19.5646 | 161.8473 | 121.9086 | 'SiO2' |
| 20 | 143.9128 ex | 63.1390 ee | 8.6080<br>96.3281 | 117.3962 | 96.3413 | 'SiO2' |

TABLE 2-continued

| | | | | | | |
|---|---|---|---|---|---|---|
| 21 | A(4) | −55.7576 ex | 28.6932 | 53.5243 | 54.4036 | 'SiO2' |
| | | DEeENTER(2) | 11.4773 | | | |
| 22 | INF | | −41.3182 | | 93.1953 | REFL |
| 23 | −134.8632 ex | 205.1295 ex | −20.6961 | 78.5675 | 81.5529 | 'SiO2' |
| | | | −25.9409 | | | |
| 24 | −193.9583 ex | 328.2670 ex | −22.4680 | 88.8258 | 88.2711 | 'SiO2' |
| | | | −0.5739 | | | |
| 25 | −99.9229 ex | S(9) | −17.2383 | 85.4425 | 80.7657 | 'SiO2' |
| | | | −7.2810 | | | |
| 26 | 325.7860 ee | −78336.2637 ec | −19.6645 | 79.3714 | 73.7499 | 'SiO2' |
| | | | −1.0430 | | | |
| 27 | −64.4960 | 8(10) | −16.3461 | 69.2870 | 62.1425 | 'siO2' |
| | | | −3.6984 | | | |
| 28 | −115.5858 | 139.9646 ex | −22.2346 | 59.4619 | 48.9186 | 'SiO2' |
| | | | −1.0000 | | | |
| 29 | 403.2131 ee | −77.5164 | −10.2071 | 47.8413 | 47.5502 | 'SiO2' |
| | | | −30.7493 | | | |
| 30 | S(11) | 50.2180 ex | −10.0000 | 51.9842 | 65.1561 | 'SiO2' |
| | | | −96.9668 | | | |
| 31 | −492.9544 ex | 289.6726 ex | −27.4688 | 156.2706 | 159.7894 | 'SiO2' |
| | | | −3.4432 | | | |
| 32 | INF | INF | −4.5909 | 163.1714 | 163.8467 | 'SiO2' |
| | | IMAGE DISTANCE | −200.0000 | | | |
| IMAGE | | INF | | 209.9432 | | |

NOTES
Positive radius indicates the center of curvature is to the right
Negative radius indicates the center of curvature is to the left
Dimensions are given in millimeters
Thickness is axial distance to next surface
Image diameter shown above is a paraxial value1 it is not a ray traced value aspheric constants $$z = \frac{2(CURV)Y^2}{1 + (1 - (1 + K)(CURV)^2 y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K<br>E | A<br>F | B<br>G | C<br>H | D<br>J |
|---|---|---|---|---|---|---|
| A(1) | −0.01522139 | 0.00000000 | −7.65414−E07 | −3.38159E−10 | 3.17124E−14 | −1.00458E−16 |
| | | 0.00000E+00 | 0.00000E+00 | 0.00000E+00 | 0.00000E+00 | 0.00000E+00 |
| A(2) | 0.01319968 | 0.00000000 | −9.49170E−08 | −2.54073E−11 | 6.43713E−16 | −1.22741E−18 |
| | | 4..26767&−22 | 6.9264.8E−27 | 0.00000E+00 | 0.00000E+00 | 0.00000E+00 |
| A(3) | 0.01319968 | 0.00000000 | −9.49170E−08 | −2.54.073E−11 | 6.43713&−16 | −1.22741E−18 |
| | | 4.26767&−22 | 6.92648&−27 | 0.00000E+00 | 0.00000E+00 | 0.00000E+00 |
| A(4) | −0.01522139 | 0.00000000 | −7.65414E−07 | −3.38159E−10 | 3.17124E−14 | −1.00458E−16 |
| | | 0.00000E+00 | 0.00000E+00 | 0.00000E+00 | 0.00000E+00 | 0.00000E+00 |

SPECIAL SURFACES
(SPS types)
QCN SURFACES
x (Y/NRADIUS)**2

$$z = \frac{2(CURV)Y^2}{1 + (1 - (1 + K)(CURV)Y)^{1/2}} + x^* + ((QC4)Q_0^{con}(x) + (QC6)Q_1^{con}(x) + \ldots + (QC30)Q_{13}^{con}(x))$$

| ASPHERIC | CURV | NRADIUS (C2)<br>QC10 (C7)<br>QC20 (C12)<br>QC30 (C17) | K (C1)<br>QC12 (CB)<br>QC22 (C13) | QC4 (C4)<br>QC14 (C9)<br>QC24 (C14) | QC6 (CS)<br>QC16 (C10)<br>QC26 (C15) | QC8 (C6)<br>QC18 (C11)<br>QC28 (C16) |
|---|---|---|---|---|---|---|
| S(1) | −0.973513E−02 | 0.487611E+02 | 0.000000E+00 | 0.378387E+01 | −0.621112E−01 | −0.356315E−01 |
| | | 0.731794E−02 | 0.219804E−02 | −0.153865E−02 | 0.596908E−03 | −0.564515E−04 |
| | | −0.808811E−04 | 0.459407E−04 | −0.156208E−04 | 0.333243E−05 | −0.122198E−05 |
| | | 0.829087E−06 | | | | |
| ASPHERIC | CURV | NRADIUS (C2)<br>QC10 (C7)<br>QC20 (C12) | K (C1)<br>QC12 (C8) | QC4 (C4)<br>QC14 (C9) | QC6 (CS)<br>QC16 (C10) | QCB (C6)<br>QC18 (C11) |
| S(2) | −0.276221E−02 | 0.841306&+02 | 0.000000E+00 | 0.100816E+01 | −0.124963E+01 | 0.224063E+00 |
| | | 0.119324E−01 | −0.450207E−01 | −0.241801E−02 | −0.546167E−02 | −0.772448E−03 |
| | | −0.535244&−03 | | | | |
| ASPHERIC | CURV | NRADIUS (C2)<br>QC10 (C7)<br>QC20 (C12)<br>QC30 (C17) | K (C1)<br>QC12 (C8)<br>QC22 (C13) | QC4 (C4)<br>QC14 (C9)<br>QC24 (C14) | QC6 (CS)<br>QC16 (C10)<br>QC26 (C15) | QC8 (C6)<br>QC18 (C11)<br>QC28 (C16) |
| S(3) | −0.304525E−02 | 0.102069&+03 | 0.000000E+00 | −0.262532E+00 | 0.397765E+00 | −0.362931E+00 |
| | | −0.949373E−01 | 0.374301E−01 | 0.128370E−01 | 0.860369E−03 | 0.247061E−02 |
| | | 0.104033E−02 | 0.243165E−03 | −0.104353E−03 | 0.197275E−05 | −0.280195E−05 |
| | | −0.613828E−05 | | | | |

TABLE 2-continued

| ASPHERIC | CURV | NRADIUS (C2) | K (C1) | QC4 (C4) | QC6 (CS) | QCS (C6) |
|---|---|---|---|---|---|---|
| | | QC10 (C7) | QC12 (C8) | QC14 (C9) | QC16 (C10) | QC18 (C11) |
| | | QC20 (C12) | | | | |
| S(4) | −0.189247E−02 | 0.127523E+03 | 0.000000E+00 | 0.160368E+01 | −0.271192E+00 | −0.436844E+00 |
| | | −0.506708E−01 | 0.909489E−01 | 0.173819E−01 | −0.523582E−02 | −0.211334E−03 |
| | | 0.452308E−03 | | | | |
| ASPHERIC | CURV | NRADIUS (C2) | K (C1) | QN (C4) | QC6 (CS) | QCS (C6) |
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(5) | −0.778948E−03 | 0.116789E+03 | 0.000000E+00 | 0.294508E+01 | 0.175887E+01 | 0.640104E+00 |
| | | 0.421577E+00 | 0.209663E+00 | 0.113198E+00 | 0.592829E−01 | 0.289839E−01 |
| | | 0.1312018−01 | 0.541851E−02 | 0.201323E−02 | 0.639625E−03 | 0.156814E−03 |
| | | 0.243417E−04 | | | | |
| ASPHERIC | CURV | NRADIUS (C2) | K (C1) | QC4 (C4) | QC6 (CS) | QCS (C6) |
| | | QC10 (C7) | QC12 (CS) | QC14 (C9) | QC16 (C10) | QC18 (C11) |
| | | QC20 (C12) | QC22 (C13) | QC24 (C14) | QC26 (C1S) | QC28 (C16) |
| | | QC30 (C17) | | | | |
| S(6) | −0.179046E−02 | 0.930078E+02 | 0.000000E+00 | −0.596787E+01 | 0.649102E+00 | 0.455904E−01 |
| | | 0.269053E−01 | 0.631820E−03 | −0.726044E−03 | −0.377982E−04 | −0.682727E−04 |
| | | −0.338822E−04 | −0.131008E−04 | 0.417233E−05 | 0.604104E−05 | 0.675039E−06 |
| | | −0.247692E−06 | | | | |
| ASPHERIC | CURV | NRADIUS (C2) | K (C1) | QC4 (C4) | QC6 (CS) | QCB (C6) |
| | | QC10 (C7) | QC12 (CB) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(7) | 0.682181E−02 | 0.619923E+02 | 0.000000E+00 | 0.423161E+00 | 0.825431E−01 | 0.590965E−02 |
| | | 0.533076E−02 | 0.509750E−03 | −0.269886E−03 | 0.154283E−05 | 0.197176E−03 |
| | | 0.201789B−03 | 0.111390E−03 | 0.356180E−04 | 0.226266E−05 | −0.360879E−05 |
| | | −0.131334E−05 | | | | |
| ASPHERIC | CURV | NRADIUS (C2) | K (C1) | QC4 (C4) | QC6 (CS) | QCB (C6) |
| | | QC10 (C7) | QC12 (CB) | QC14 (C9) | QC16 (C10) | QC1B (C11) |
| | | QC20 (C12) | QC22 (C13) | QC24 (C14) | QC26 (C1S) | QC28 (C16) |
| | | QC30 (C17) | | | | |
| S(8) | 0.946349E−02 | 0.874647E+02 | 0.000000E+00 | 0.333032E+00 | 0.393444E+00 | 0.238999E+00 |
| | | 0.103805E+00 | 0.378371E−01 | 0.138394E−01 | 0.586889E−02 | 0.261713E−02 |
| | | 0.105847E−02 | 0.363582E−03 | 0.103241E−03 | 0.230688E−04 | 0.348823E−05 |
| | | 0.200017E−06 | | | | |
| ASPHERIC | CURV | NRADIUS (C2) | K (C1) | QC4 (C4) | QC6 (CS) | QCB (C6) |
| | | QC10 (C7) | QC12 (CB) | QC14 (C9) | QC16 (C10) | QC1B (C11) |
| | | QC20 (C12) | | | | |
| S(9) | −0.170716E−02 | 0.424898E+02 | 0.000000E+00 | −0.120082E+01 | 0.526650E−01 | −0.992522E−02 |
| | | 0.222213E−03 | 0.745948E−04 | 0.429593E−04 | 0.284206E−04 | 0.940072E−05 |
| | | −0.140987E−05 | | | | |
| ASPHERIC | CURV | NRADIUS (C2) | K (C1) | QC4 (C4) | QC6 (CS) | QCB (C6) |
| | | QC10 (C7) | QC12 (CS) | QC14 (C9) | QC16 (C10) | QC18 (C11) |
| | | QC20 (C12) | | | | |
| S(10) | −0.919805E−02 | 0.326272E+02 | 0.000000E+00 | 0.697360E+00 | −0.251306E+00 | 0.476654E−0 |
| | | −0.477917E−02 | 0.792375E−03 | −0.367732E−05 | 0.774079E−04 | −0.749161E−04 |
| | | −0.156406E−04 | | | | |
| ASPHERIC | CURV | NRADIUS (C2) | K (C1) | QC4 (C4) | QC6 (CS) | QCB (C6) |
| | | QC10 (C7) | QC12 (C8) | QC14 (C9) | QC16 (C10) | QC18 (C11) |
| | | QC20 (C12) | | | | |
| S(11) | 0.331921E−01 | 0.274245E+02 | 0.000000E+00 | −0.872183E+00 | −0.208814E+00 | −0.582689E−01 |
| | | −0.177865E−01 | −0.522035E−02 | −0.124980E−02 | −0.151796E−03 | 0.355708E−04 |
| | | 0.199772E−04 | | | | |

DECENTERING CONSTANTS

| DECENTER | x | y | z | ALPHA | BETA | GAMMA | |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 45.0000 | 0.0000 | 0.0000 | (BEND) |

A decanter defines a new coordinate system (displaced and/or rotated) in which subsequent surfaces are defined.
Surfaces following a decanter are aligned on the local mechanical axis {z-axis} of the new coordinate system.
The new mechanical axis remains in use until changed by another decanter. The order in which displacements and tilts are applied on a given surface is specified using different decanter types and these generate different new coordinate systems; those used here are explained below. Alpha, beta, and gamma are in degrees.

DECENTERING CONSTANT KEY:

| TYPE | TRAILING CODE | ORDER OF APPLICATION |
|---|---|---|
| DECENTER | | DISPLACE {X, Y, Z} |
| | | TILT (ALPHA, BETA, GAMMA) |
| | | REFRACT AT SURFACE |
| | | THICKNESS TO NEXT SURFACE |
| DECENTER & BEND | BEND | DECENTER (X, Y, Z, ALPHA, BETA, GAMMA) REFLECT AT SURFACE |

TABLE 2-continued

| REFERENCE WAVELENGTH | 193.3 NM | BEND (ALPHA, BETA, GAMMA) THICKNESS TO NEXT SURFACE |
|---|---|---|
| SPECTRAL REGION | 193.3 | 193.3 NM |

In the diagram below, surface 1 is the wafer, surface 60 is the SLM.

What is claimed is:

1. A projection optics for a lithographic projection system, comprising:
   a catadioptric projection lens with at least one concave mirror, and
   optical elements between an image plane and the at least one concave mirror,
   wherein the projection optics is an object-side non-telecentric optical system, configured to provide an image reduction by at least a factor of 10 and to satisfy the following condition:

$4 < R_m/[2*\text{Half Field}] < 7$, wherein $R_m$ is a radius of the concave mirror,
   and Half Field is the half field height of the image field.

2. The projection optics of claim 1, further comprising an aperture stop,
   wherein the projection optics satisfies the following condition $79 < D/[\text{Half Field}] < 100$, wherein D is a sum of thicknesses of all of optical elements that light traverses upon propagation between the image plane and the aperture stop.

3. The projection optics of claim 1, comprising:
   a first imaging optical system arranged between an object surface and an image surface, said first imaging optical system forming, in operation, a first intermediate image of the object surface;
   a second imaging optical system having a concave mirror, said second imaging optical system forming, in operation, a second intermediate image of the object surface; and
   a third imaging optical system arranged between the first imaging optical system and the image surface, said third imaging optical system forming, in operation, a final image on the image surface.

4. The projection optics of claim 3, wherein an optical axis of the first imaging optical system and an optical axis of the third imaging optical system are coaxial.

5. The projection optics of claim 1, wherein the projection optics is configured to forms an image off an optical axis of the projection optics.

6. A projection optics for a lithographic projection system, comprising:
   a catadioptric projection lens including at least one concave mirror, an aperture stop, and optical elements between an image plane and the aperture stop;
   wherein the projection optics is configured provide an image reduction by at least a factor of 20;
   wherein the projection optics satisfies the following condition: $10 < R_m/[2*\text{Half Field}] < 13$, wherein $R_m$ is a radius of the concave mirror and Half Field is a half field height of an image field.

7. The projection optics of claim 6, comprising:
   a first imaging optical system arranged between an object surface and an image surface, said first imaging optical system forming, in operation, a first intermediate image of the object surface;
   a second imaging optical system having a concave mirror, said second imaging optical system forming, in operation, a second intermediate image of the object surface; and
   a third imaging optical system arranged between the first imaging optical system and the image surface, said third imaging optical system forming, in operation, a final image on the image surface.

8. The projection optics of claim 7, wherein an optical axis of the first imaging optical system and an optical axis of the third imaging optical system are coaxial.

9. The projection optics of claim 6, wherein the projection optics is configured to forms an image off an optical axis of the projection optics.

* * * * *